United States Patent [19]

Schuster et al.

[11] Patent Number: 5,016,804
[45] Date of Patent: May 21, 1991

[54] SOLDERING APPARATUS HAVING AT LEAST ONE STIRRUP ELECTRODE

[75] Inventors: Rudolf Schuster, Heimstetten; Georg Ketzer, Unterhaching, both of Fed. Rep. of Germany

[73] Assignee: Siemens Aktiengesellschaft, Berlin and Munich, Fed. Rep. of Germany

[21] Appl. No.: 459,946

[22] Filed: Jan. 2, 1990

[30] Foreign Application Priority Data

Jan. 10, 1989 [DE] Fed. Rep. of Germany ....... 3900522

[51] Int. Cl.$^5$ .............................................. B23K 20/02
[52] U.S. Cl. ........................................ 228/51; 228/55; 219/85.18; 219/233; 219/243
[58] Field of Search .................... 228/180.2, 44.7, 51, 228/55, 44.3, 179; 219/85.16, 85.18, 228, 243, 233

[56] References Cited

U.S. PATENT DOCUMENTS

| 4,768,702 | 9/1988 | Takahashi et al. | 228/44.7 |
| 4,851,648 | 7/1989 | Jacobs et al. | 228/44.7 |
| 4,875,614 | 10/1989 | Cipolla et al. | 228/44.7 |
| 4,894,506 | 1/1990 | Woerner | 219/85.16 |

FOREIGN PATENT DOCUMENTS

| 3149236 | 8/1982 | Fed. Rep. of Germany . | |
| 2185432 | 7/1987 | United Kingdom | 228/180.2 |

OTHER PUBLICATIONS

IBM Technical Disclosure Bulletin, "Self Leveling Soldering Tool", vol. 11, No. 8, p. 1026, Jan. 1969.

*Primary Examiner*—Sam Heinrich
*Attorney, Agent, or Firm*—Hill, Van Santen, Steadman & Simpson

[57] ABSTRACT

The soldering apparatus using at least one resistance heated stirrup electrode that is place onto soldering locations on a printed circuit board includes a pivotable suspension of the stirrup electrode. The pivotable suspension is such that a dislocated rotational axis of pivotable suspension lies in a plane of the working surface and extends perpendicular to a long side of the rectangular working surface of electrode and at the center thereof. The working surface of the stirrup electrode thus achieves reliable contact with parts to be soldered. Embodiments having two or four soldering stirrups, each individually pivotly suspended, are also possible.

10 Claims, 2 Drawing Sheets

SOLDERING APPARATUS HAVING AT LEAST ONE STIRRUP ELECTRODE

BACKGROUND OF THE INVENTION

1. Field of the Invention

The present is directed generally to a soldering apparatus having at least one stirrup electrode and more, particularly, to a soldering apparatus for placing a rectangular work surface of a stirrup electrode onto a soldering location.

2. Description of the Related Art

A soldering apparatus is disclosed, for example, in German published application 31 49 236. In this known soldering apparatus, an electrode holder includes small columns of conductive material electrically insulated from one another between whose ends at least two stirrup electrodes are secured in interchangeable fashion. The U-shaped stirrup electrodes that can be heated by electrical resistance heating are made of a planar plate of resistor material, such as tantalum or molybdenum, and are attached in such fashion that their working surfaces lying at their underside to come into contact with elements to be soldered. Given two stirrup electrodes lying opposite one another, or four stirrup electrodes lying opposite one another in pairs, a total of four small columns are required for the electrode holders. The columns are arranged in a respective diagonal of the cross-section of the soldering apparatus and are mechanically connected to one another by a plurality of cross-shaped bracings. For the power supply of the four stirrup electrodes, two small columns lying on a diagonal are connected to one pole of a power source, while the two other small columns are connected to the other pole of the power source.

A soldering apparatus having two stirrup electrodes lying parallel and opposite to one another, or having four stirrup electrodes lying opposite to one another in pairs, is particularly utilized for soldering electronic components, such as multiple micropacks, flatpacks and the like, to printed circuit boards. The resistance heating of the stirrup electrodes is caused by current pulses which pass therethrough.

Reliable contact between the working surfaces of the stirrup electrodes, the terminal legs of the components, and the interconnects or terminal pads of the printed circuit boards must be guaranteed both before the soldering process as well as over the entire duration of the soldering process. This requirement, however, cannot be always be met in view of the possible electrical arcing which occurs on the printed circuit boards, the tolerance variations of the printed circuit boards in a direction perpendicular to the plane of the circuit board, the tolerance variations in layer thicknesses, and the possible skewed positioning of the printed circuit boards during the soldering process.

SUMMARY OF THE INVENTION

It is an object of the present invention to guarantee adequate contact between the working surfaces of a stirrup electrode, the terminal legs of components, and interconnects and terminal pads on a printed circuit board both before the soldering process begins and during the soldering process.

Another object of the invention is to enable the solder locations to be visually inspected with an unobstructed view between soldering events. These and other objects of the invention are achieved by an improved soldering apparatus which includes a pivotable suspension of a stirrup electrode for pivoting about a dislocated rotational axis lying in a plane of the working surface and at a center perpendicular of the longer sides of the working surface.

The present invention is based on the perception that a stirrup electrode should be pivotably suspended and, when a plurality of stirrup electrodes are provided, that each and every stirrup electrode should be individually pivotably suspended. Such pivotable suspension provides optimum parallelism compensation between a respective electrode working surface and a printed circuit board when the swivel motions required for this purpose are undertaken about a dislocated rotational access that lies centrally in the plane of the working surface and is aligned perpendicular to the lateral surface of the stirrup electrode. Only when the rotational axis is in such position can undesired and injurious forces in the direction of the plane of the printed circuit board be avoided when placing the working surface of the stirrup onto a soldering location. During placement of the electrode onto a soldering location, only at most slight normal, or perpendicular, forces are exerted against he printed circuit board for the parallelism compensation of the electrode. The greater pressures, or forces, required for the soldering process are then applied only after the parallelism compensation has been achieved and are applied exclusively as normal forces.

In a preferred development of the invention, the stirrup electrode is secured to a holder which is pivotable about the dislocated rotational axis via a steering guide formed of two rocker arms. The pivotable suspension of the stirrup electrode around a dislocated rotational axis can be realized in an especially simple way with such a steering guide.

In another preferred development of the invention, the stirrup electrode is secured to a holder which is pivotable around the dislocated rotational axis and the holder is raisible and lowerable in a vertical direction and is arranged to be movable in a horizontal direction only when away from the soldering location. With such arrangement, first, it is possible to press the soldering stirrup onto the soldering location with a normal force required for the soldering process, while on the other hand, the soldering stirrup can be moved in an outward direction before being placed onto the soldering location or after being raised from the soldering location and thereby provide an unobstructed view from above onto the soldering location. This movement of the stirrup electrode is possible to realize in an especially simple way by a holder being rigidly connected with a coupler of a four-bar chain, or movement linkage of four rigid bars. In this case, it is especially beneficial when a coupler movement curve of the linkage proceeds at least nearly exclusively in a vertical direction in the proximity of the soldering location and only has components in a horizontal direction with increasing distance from the soldering location. An arrangement of elements to provide such coupling movement curve reliably guarantees that only normal forces are transmitted onto the soldering location.

Advantageously, every stirrup electrode of a soldering apparatus has a separately driveable holder allocated to it. This permits every individual stirrup electrode in the soldering apparatus to be moved in an outward direction and thus enables the soldering locations to be viewed with an unobstructed view. For example, the soldering apparatus may have two stirrup electrodes lying opposite one another or have four stirrup electrodes in pairs lying opposite one another. It is possible to further improve the visual monitoring of the solder process in a soldering apparatus having four stirrup electrodes lying opposite one another in pairs by successively placing the stirrup electrodes onto the soldering locations in pairs.

DESCRIPTION OF THE PREFERRED EMBODIMENTS

Figure 1:
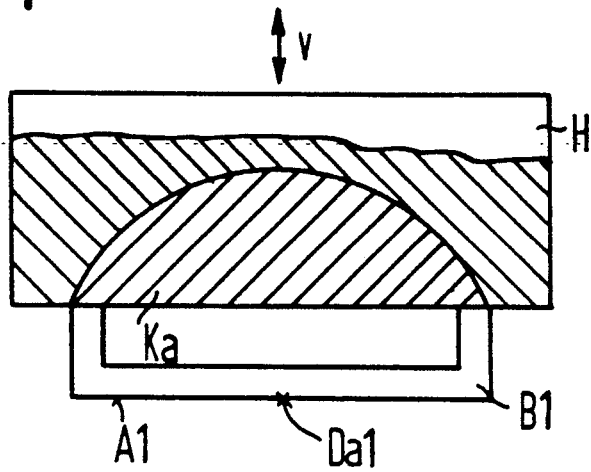
FIG. 1 shows a cross section through a greatly simplified soldering apparatus of the invention having a pivotable individual suspension of a U-shaped flat soldering stirrup, according to the principles of the present inventions.

FIG. 1 shows a greatly simplified schematic view of an apparatus illustrating a fundamental principle of the present invention, whereby those parts such as power leads and the like that are not required for understanding of the invention have been omitted from the figure. A U-shaped flat soldering stirrup B1 is shown as a soldering means and is manufactured from a planar plate having a rectangular working surface A1 lying at an underside of the stirrup B1 for placement onto a soldering location by movement or a holder H1 in a vertical direction and for lifting off from the soldering location after the conclusion of the soldering process. The flat solder stirrup B1 is pivotably suspended in the holder H1 for pivotable movement about a dislocated rotational access Da1 which lies in the plane of the working surface A1. The rotational axis Da1, which is indicated by a cross in FIG. 1, proceeds perpendicular to the plane of the drawing and is arranged in the middle of the longer side of the working surface A1 and aligned perpendicular to the lateral surface of the flat soldering stirrup B1.

During placement of the flat soldering stirrup B1 onto a soldering location, pivot motion about the dislocated rotational axis Da1 may possibly be required to achieve an optimum contact at the soldering location. In FIG. 1, this is accomplished by the flat soldering electrode B1 being secured in a circular disk segment Ka whose axis corresponds to the rotational axis Da1, the rotational axis Da1 of course not being physically present. The circular disk segment Ka1 is arranged in a corresponding recess which has the shape of the circular disk in the holder H1. Since the principle of the invention is being illustrated in greatly simplified terms, the necessary components for physical cohesion between the holder H1 and the circular disk segment Ka which are required are not shown.

Figure 2:
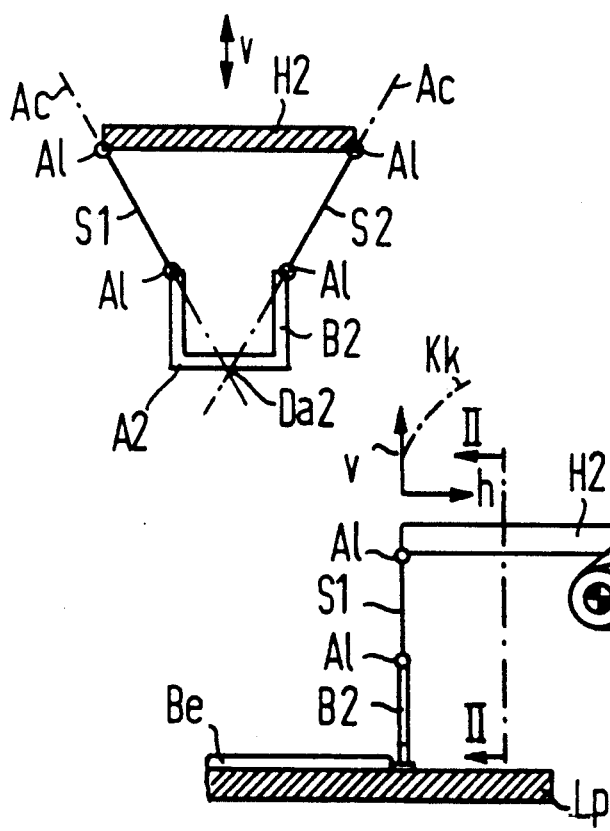
FIG. 2 is a schematic representation of a steering guide for pivotable individual suspension of a U-shaped flat soldering stirrup from a holder along line II—II of FIG. 3.

In FIG. 2, a pivotable suspension for the U-shaped flat soldering stirrup B2 is in the form of a steering guide connected to a holder H2. The steering guide includes two rocker arms S1 and S2 whose respective ends are hinged to the holder H2 and to the flat soldering stirrup B2 at hinge locations A1. The rotational axes of articulation of the rockers S1 and S2 relative to the holder H2 and to the flat soldering stirrup B2 corresponds to the hinge locations A1 and are aligned parallel to a rotational axis of pivotable suspension which is referenced Da2. An exact pivot of the flat soldering stirrup B2 around the rotational axis Da2 in the steering guide as illustrated is enabled in that longitudinal axes Ac of the rockers S1 and S2 intersect in the center of a working surface A2 of the flat soldering stirrup B2. The intersection of the longitudinal axes Ac thus lies on the rotational axis Da2.

Figure 3:
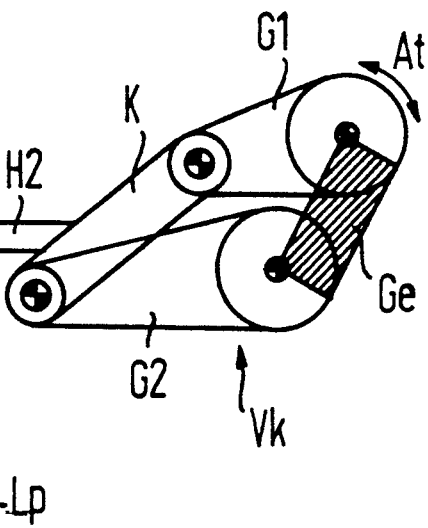
FIG. 3 is a schematic representation of a drive means for the holder of FIG. 2 including a four-bar chain, or movement linkage of four rigid bars.

The steering guide for the flat soldering stirrup B2 shown in FIG. 2 corresponds to a cross section along line II—II of FIG. 3. In FIG. 3 may further be seen the longitudinal extent of the holder H2 which is rigidly connected to a coupler K of a four-bar chain, or movement linkage of four rigid bars, Vk having a fixed frame Ge and two other elements G1 and G2. The element G1 is driven at the fixed frame side in the direction of double arrow At via, for example, a DC motor. The coupler K for the fixed frame Ge and the elements G1 and G2, thus, represent four rigid bars of the movement linkage Vk.

As merely shown schematically in FIG. 3, the movement linkage Vk has the job of moving the flat soldering stirrup B2 both in a vertical direction v as well as in a horizontal direction h. The resulting motion is referred to as a coupler curve Kk, indicated by a broken line above the horizontal and vertical axes v and h. The four bar movement linkage Vk is designed such that the coupler curve Kk moves the flat soldering stirrup B2 first only in a vertical direction v when being initially lifted or lowered, and a movement in the horizontal direction h is then superimposed thereon at increasing distances from the soldering location. The movement in the horizontal direction h is thereby outwardly directed away from a component Be which is to be soldered onto a printed circuit board Lp, so that a free unobstructed view onto the component Be and onto the soldering location is possible when the flat soldering stirrup B2 is lifted off.

The preferred movement is accomplished by the element G1 being generally the same length as the fixed frame Ge, the coupler K being longer and the element G2 being longer still. The mounting angle and position of the fixed frame Ge also determines movement relative to the solder location.

The principles of the present invention are applicable to suspension and motion of not only a single flat soldering stirrup B2, as shown in FIGS. 2 and 3, but also to a plurality of flat soldering stirrups such as two flat soldering stirrups lying opposite one another or four flat soldering stirrups lying opposite one another in pairs. The corresponding holders for these soldering stirrups are each directed outwardly away from the soldering location. The soldering apparatus having four soldering stirrup electrodes lying opposite one another in pairs preferably provides that the stirrup electrodes can be successively placed onto the soldering locations in pairs. An optimum monitoring of the soldering process is thereby possible. The pivotable individual suspension of each and every stirrup electrode guarantees optimum contact of the working surface with the soldering location.

Figure 4:
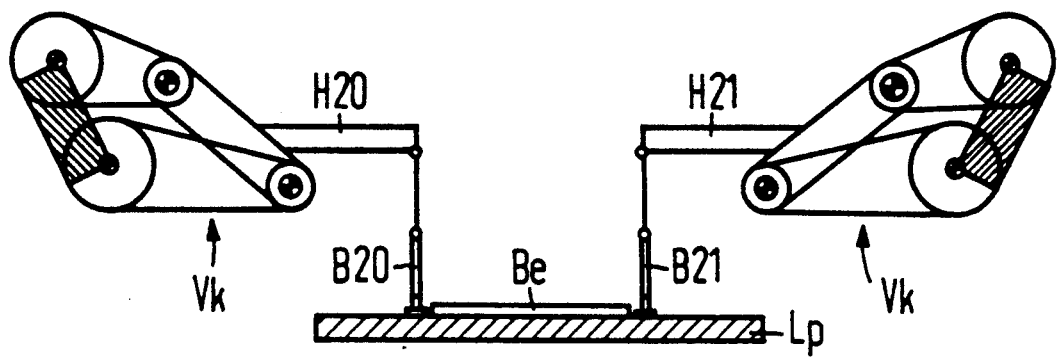
FIG. 4 is a schematic representation of an embodiment of the invention having two stirrup electrodes, each individually pivotably suspended.

For example, FIG. 4 shows two flat soldering stirrups B20 and B21 lying opposite one another. The corresponding holders H20 and H21 for these soldering stirrups are each connected to a separate movable linkage Vk.

Figure 5:
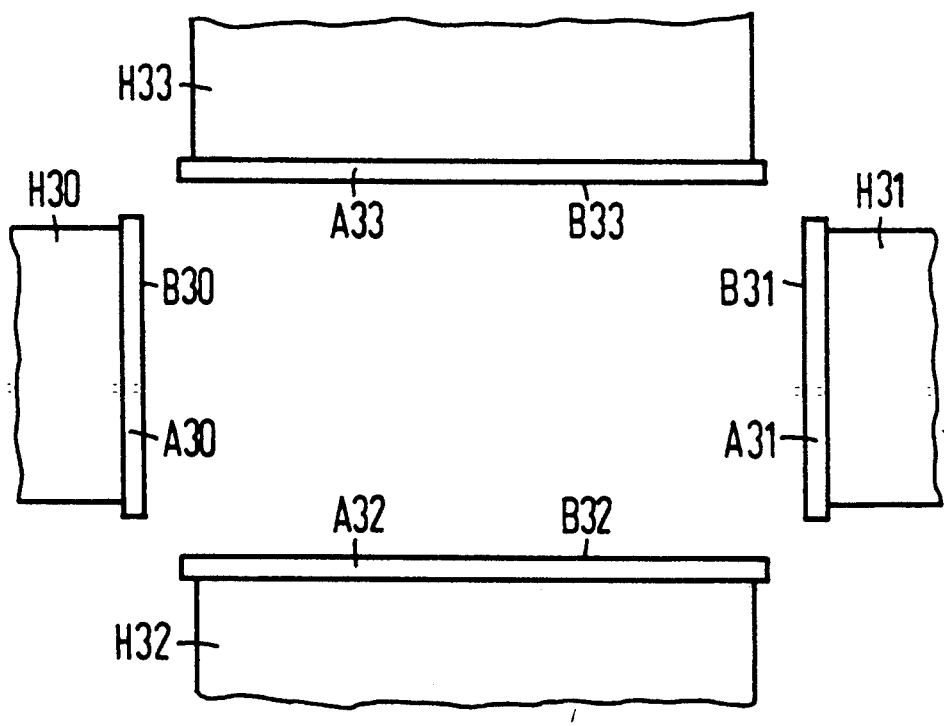
FIG. 5 is a partial bottom view of an embodiment of the invention having four stirrup electrodes, each individually pivotably suspended.

In FIG. 5 is shown the corresponding working surfaces A30, A31, A32, and A33 of four flat soldering stirrups B30, B31, B32, and B33 lying opposite one another in pairs. The corresponding holders H30, H31, H32, and H33 for these soldering stirrups B30, B31, B32, and B33 are each directed outwardly away from the soldering location. Corresponding movement linkages (not shown) are used to place the stirrups B30, B31, B32, and B33 onto the soldering locations in pairs.

The present invention thereby provides a soldering apparatus having at least one stirrup electrode heatable by electrical resistance heating which includes a rectangular working surface for placement onto and preferably exactly parallel to a soldering location on a printed circuit board. By pivotably suspending this stirrup electrode so that a dislocated rotational axis of pivotable suspension lies in a plane of the working surface and extends perpendicular to and in the center of a long side of the working surface, good contact to the parts to be soldered with the working surface of the electrode is guaranteed. In embodiments having two or four soldering stirrups, each one of the stirrups is individually suspended.

Although other modifications and changes may be suggested by those skilled in the art, it is the intention of the inventors to embody within the patent warranted hereon all changes and modifications as reasonably and properly come within the scope of their contribution to the art.

We claim:

1. A soldering apparatus, comprising:
   at least one stirrup electrode having a generally rectangular working surface for placement onto a soldering location;
   a pivotable suspension connected to said at least one stirrup electrode, said pivotable suspension operating to move said at least one stirrup electrode about a rotational axis lying in a plane of said working surface, said rotational axis lying substantially along a center perpendicular of longer sides of said rectangular working surface.

2. A soldering apparatus as claimed in claim 1, wherein said pivotable suspension includes:
   a holder; and
   a steering guide including two rocker arms connected between said holder and said stirrup electrode to permit pivoting of said stirrup electrode about said rotational axis.

3. A soldering apparatus comprising:
   at least one stirrup electrode having a generally rectangular working surface for placement onto a soldering location:
   a pivotable suspension connected to said at least one stirrup electrode, said pivotable suspension having a rotational axis lying in a plane of said working surface, said rotational axis lying substantially along a center perpendicular of longer sides of said rectangular working surface;
   a holder to which said stirrup electrode is secured for pivoting about said rotational axis; and
   means for raising and lowering said holder in a generally vertical direction when said at least one stirrup electrode is adjacent a soldering location, said raising and lowering means also moving said holder outwardly away from a soldering location in a generally horizontal direction when remote from a soldering location.

4. A soldering apparatus as claimed in claim 3, wherein said means includes a movement linkage of four bars rigidly connected to said holder.

5. A soldering apparatus as claimed in claim 4, wherein said movement linkage is formed such that said stirrup electrode moves along a coupling movement curve to and from a soldering location, said coupling movement curve having a predominantly vertical movement direction in a proximity of the soldering location and an increasing horizontal component of movement with increasing distance from said solder location.

6. A soldering apparatus as claimed in claim 1, further comprising:
   a plurality of further stirrup electrodes; and
   a separately driveable holder allocated to each of said further stirrup electrodes.

7. A soldering apparatus as claimed in claim 1, wherein said at least one stirrup electrode is four stirrup electrodes arranged opposite one another in pairs, and further comprising:
   means for successively placing said four stirrup electrodes in place onto soldering locations in pairs.

8. A soldering apparatus for soldering electrical contacts at solder locations, comprising:
   a stirrup electrode having an elongated surface for placement onto the solder locations, said elongated surface having a major axis and a minor axis perpendicular to the major axis, each of said major axis and said minor axis lying in a plane defined by said elongated surface;
   means for suspending said stirrup electrode for pivoting movement about said minor axis in said plane of said elongated surface, said means for suspending achieving said pivoting movement by pivoting at locations remote from said minor axis.

9. A soldering apparatus as claimed in claim 8, wherein said minor axis substantially bisects said elongated surface.

10. A soldering apparatus as claimed in claim 8, wherein said means for suspending includes first and second rocker arms having hinge connections at each of their opposite ends, said first and second rocker arms each being connected to said stirrup electrode at one hinge connection.

* * * * *